United States Patent [19]

Sugatani

[11] Patent Number: 4,734,887
[45] Date of Patent: Mar. 29, 1988

[54] ERASABLE PROGRAMMABLE READ ONLY MEMORY (EPROM) DEVICE AND A PROCESS TO FABRICATE THEREOF

[75] Inventor: Shinji Sugatani, Machida, Japan
[73] Assignee: Fujitsu Limited, Kawasaki, Japan
[21] Appl. No.: 941,439
[22] Filed: Dec. 15, 1986
[30] Foreign Application Priority Data
　　Jan. 14, 1986 [JP] Japan ................................ 61-005310
[51] Int. Cl.⁴ ........................ G11C 13/00; G11C 11/40
[52] U.S. Cl. ........................................ 365/185; 365/53
[58] Field of Search .................. 365/185, 189, 53, 230

[56] References Cited
U.S. PATENT DOCUMENTS 4,618,876 10/1986 Stewart et al. ...................... 365/185
4,622,656 11/1986 Kamiya et al. ..................... 365/185

*Primary Examiner*—Terrell W. Fears
*Attorney, Agent, or Firm*—Staas & Halsey

[57] ABSTRACT

A structure of high packing density EPROM having floating gate type FET memory cells and a fabrication process thereof are disclosed. Marginal spaces for mask alignment and bird's beak in prior art EPROM device have been cut down by applying a self alignment technique to determine both the gate length and gate width. The process for fabricating the device is disclosed. On a substrate first gate insulation film and first conductive polysilicon layer are formed. Parallel grooves for device separation are formed in a direction of gate length by photolithography. The space between the groove defines the gate width, and the width of the groove determines the spacing between the cell FETs. The groove is buried by SiO₂ deposited chemical vapor deposition. The surface is etched to expose the first polysilicon layer. On this surface, a second gate insulation film and second conductive polysilicon layer are formed. The substrate is then etched leaving a parallel stripes orthogonal to the device separation grooves. The spacing of the stripe determines the device separation in the direction of gate length. Utilizing this stripes as a mask, the substrate is etched off to expose the substrate. To the exposed substrate are doped to form sources and drains. Applying the inventive process, the packing density of the memory cell has been increased by 30%.

5 Claims, 17 Drawing Figures

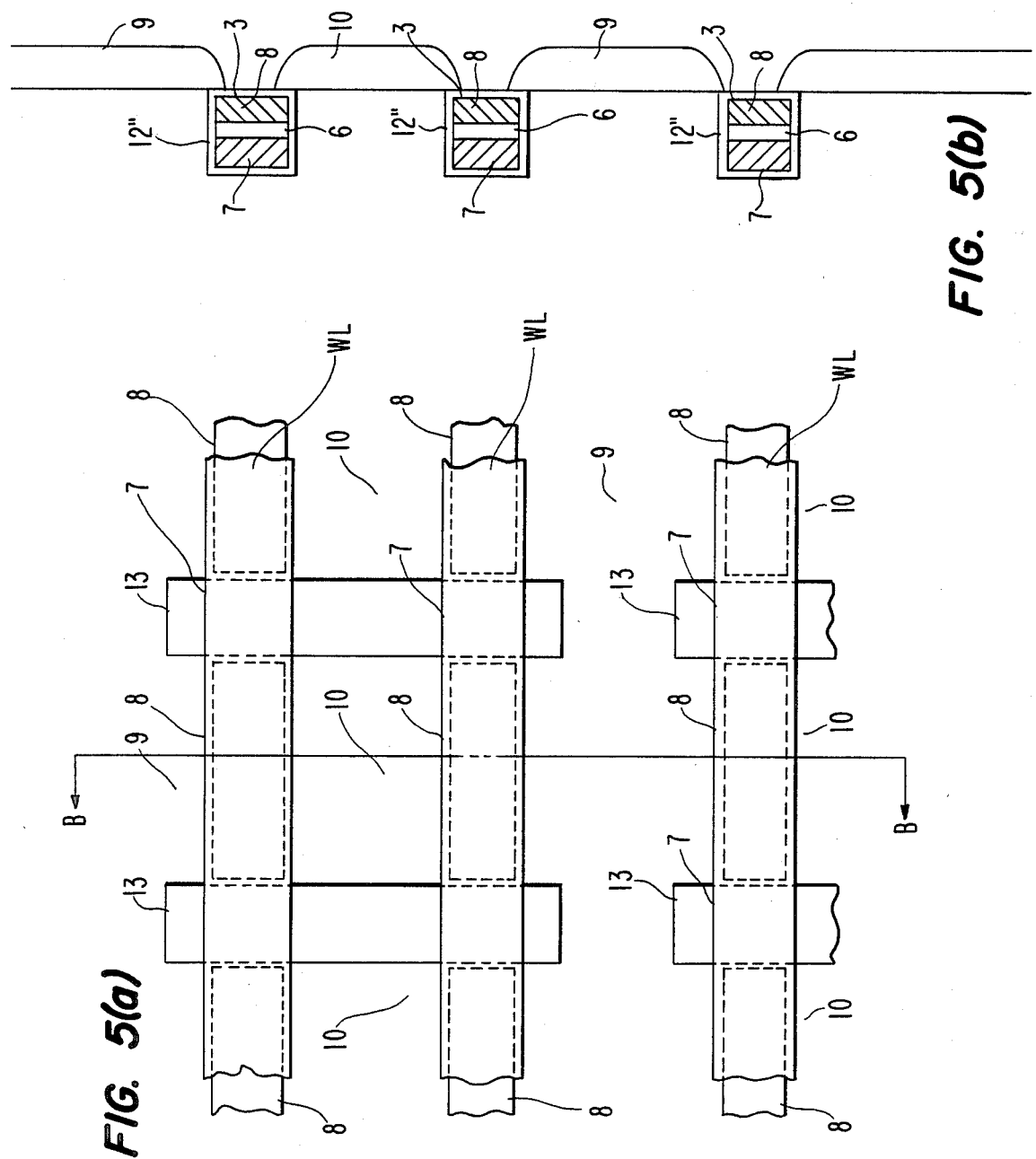

ERASABLE PROGRAMMABLE READ ONLY MEMORY (EPROM) DEVICE AND A PROCESS TO FABRICATE THEREOF

BACKGROUND OF THE INVENTION

The present invention is related to a highly integrated erasable programmable read only memory (EPROM) device and a process to fabricate it. More precisely, it is related to an EPROM whose device packing density is increased by utilizing a self alignment technique.

It is important to cut down a marginal space in circuit pattern in order to increase the packing density of element devices on the IC. The self alignment technique is one of effective methods to cut down the marginal space for photolithographic mask alignment process for fabricating the ICs.

In ordinary EPROM devices which is composed of MOS-FET (metal-oxide-semiconductor type field effect transistor) having a floating gate, the self alignment is applied to cut down the marginal space on both sides of gate to determine the length of a gate of the FETs. But it is necessary to leave a margin for mask alignment to determine the width of the floating gate. Such situation will be explained briefly with respect to FIGS. 1 and 2.

FIG. 1 is a plan view of an elementary memory cell of an EPROM device, schematically illustrating steps of its fabrication process, while FIG. 2 is a sectional view along the line AA and seen in the direction of arrows in FIG. 1 corresponding to respective fabrication steps. As shown in FIGS. 1(a) and 2(a), on a p-type silicon substrate 1 for example, is fabricated a silicon dioxide (SiO$_2$) film 2 by ordinary selective oxidation. This SiO$_2$ film is patterned like islands arranged in a matrix on the substrate 1 for separating the devices between each other. Such SiO$_2$ layers are called as field oxide layer.

Next, as shown in FIGS. 1(b) and 2(b), the entire surface of the substrate is covered with a first gate oxide film 3 of SiO$_2$ which is formed by thermal oxidation. Subsequently, the surface is covered by a first conductive polysilicon layer (PA) 5. The first polysilicon layer 5 is patterned to form stripes separated from each other by grooves 4 which are formed by etching. Each of the groove 4 is positioned on the center of a column of the field oxide layer 2, so, the field oxide layer 2 is exposed at its center part. Each stripes having a width W$_F$ bridges between the adjacent columns of the field oxide layers 2 as shown in FIG. 1(b). The width W$_F$ of the stripe becomes later the width of the floating gate of the FET. The direction of the line AA in FIG. 1 or the direction of the width W$_F$ in FIG. 2 will be referred to as a direction of gate width, and the direction orthogonal to it, namely the direction of the arrows in FIG. 1 will be referred to as a direction of gate length hereinafter.

Subsequently, as shown in FIGS. 1(c) and 2(c), the entire surface of the substrate is covered with second gate oxide film 6 by thermal oxidation. Next, the surface is covered by second conductive polysilicon layer (PB) 7. Then, the second gate oxide layer 6 and the stripes of the first polysilicon layer 5 are selectively etched off leaving a second stripes which are orthogonal to the grooves 4. The second stripes have a predetermined width W$_C$ which becomes later the gate length of the FET. By this etching process, the protions of the first stripes 5 which are covered by the second stripes 7 become the gate 8 of the FETs. And the second stripes 7 become control gate. They are extended in horizontal direction in the figure, and become word lines. Like such a manner, the floating gates 8 are formed underneath the control gate 7 separated from it by the second gate oxide film 6. The width and length of the floating gates 8 are respectively W$_F$ and W$_C$.

Then, the surface of the p-type silicon substrate 1 exposed from the second stripe are doped by n-type impurities by ion implantation, for example, to from n$^+$-type source 9 and drain 10.

Though in FIG. 1(c) the floating gate 8 is shown by a broken line slightly narrower than the control gate 7 in order to identify it, but as can be understood from the above explanation, the control gate 7 and the floating gate 8 are self aligned to each other and have a substantially same width, because the floating gate 8 is etched using the self alignment technique utilizing the control gate 7 as a mask. Therefore, there is no need to prepare a marginal space for mask alignment between the control gate and the floating gate in the direction of the gate length. So, the packing density of the FETs in the direction of their gate length is increased to the limit determined by resolution of photolithography. But in the direction orthogonal to it (in the direction of gate width), on the contrary, the marginal space is necessary.

As has been described before, the grooves 4 in FIGS. 1 and 2 must be aligned to respective column of the field oxide layers 2. Since the grooves 4 are formed by photolithographic etching, it is necessary, as shown in FIGS. 1(c) and 2(c), to provide a marginal space W$_A$ on both sides of the grooves 4 having a width W$_S$. In the present-state-of-the-art photolithography, the marginal spaces W$_A$ of approximately 0.3–0.5 μm are necessary on both sides of a groove having width W$_S$ of 0.6–1 μm for example. Therefore, the packing density of the FETs in the direction of gate width can not be increased to the limit determined by the resolution of photolithography.

Another fact to decrease the packing density in the direction of gate width are invalid spaces under the both sides of the floating gate width W$_F$ in FIG. 2(b). These invalid spaces are identified by 11 in FIG. 2. They are called in the art as "bird's beak". They are inevitably formed on both sides of the field oxide layers 2. The birds beak extends sometimes 1 μm on both side of the field oxide layer 2, and it does contribute neither to the conductance of the FET nor the capacitance of the floating gate. So, desire to cut down these marginal spaces and the bird's beaks is increasing in the large scale integrated EPROMs.

Recently, an attempt to cut down the marginal space for mask alignment by self alignment technique have been proposed by H. Nozawa et al. in "CHARACTERISTICS AND RELIABILITY OF THE SEPROM CELL" in IEEE Trans. ED vol. ED-31, No. 10, October 1984. Schematic diagrams illustrating the fabrication process are shown in FIG. 3. They piled successively on a substrate 21, a first gate oxide layer 23, first conductive polysilicon layer 25 and a silicon nitride film 31. And patterned the silicon nitride film 31 as shown in FIG. 3(a). Then as shown in FIG. 3(b), the first polysilicon layer 25 is oxidized to form the field oxide layers 22 using the silicon nitride film 31 as a mask. After removing the silicon nitride film 31, a second gate oxide layer 26 is formed. Next, second conductive polysilicon layer 27 is formed as shown in FIG. 3(c). Then the substrate is etched like a similar manner of FIGS. 1(c) and 2(c), and is implanted with n-type impurity to form an n+-type source 29 and drain 30. A cross sectional view of the device cut along a line from source to drain becomes as shown in FIG. 3(d).

Like a manner described above, the control gate 27 and the floating gate 25 are self aligned to each other. But the bird's beak is still remained. And as can be estimated from the shape of FIG. 3(c), the capacitance between the floating gate and the control gate becomes smaller than that between the floating gate and the channel region. This decreases the sensitivity of the control gate and the programming efficiency of the FET. Moreover, flatness of the surface of the device is not so smooth. This incurs a problem on wiring for interconnecting the devices on the IC chip.

SUMMARY OF THE INVENTION

General object of the present invention, therefore, is to provide an EPROM device having very high packing density of element devices, and provide a process to fabricate it.

An object of the present invention is to provide a structure and production process of an EPROM device which enables to cut down marginal spaces on the IC chip.

Another object of the present invention is to provide a fabrication process of an EPROM device whose chip surface is smooth to attain high reliability of interconnection wiring for element devices on the chip surface.

The present invention applies a self alignment technique for fabricating a floating gate of the memory FET. The self alignment technique is applied in both directions of the gate width and gate length to cut down the marginal spaces for mask alignment.

The every floating gate is spaced its periphery by separation grooves formed by etching, so there appears no bird's beak. These grooves are filled with silicon dioxide, so, the surface of the chip is smooth.

The process for fabricating the EPROM device by the present invention comprises following main steps.

(a) Forming successively first gate insulation film and first conductive layer on a substrate.

(b) Forming separation grooves arranged in parallel to each other and extended in a direction of gate length of the memory cell FETs to be fabricated on the substrate. The space between these separation grooves are equal to the gate width of the memory cell FETs, and the depth of the grooves is so deep as to penetrate through the fist conductive layer and the first gate insulation film to dig into the substrate.

(c) Forming a thick insulation layer over the substrate to bury the separation grooves formed by the process (b).

(d) Etching off the thick insulation layer formed by the process (c) to expose the surface of the first conductive layer.

(e) Forming second gate insulation film over the surface of the first conductive layer exposed by the process (d), and subsequently forming a second conductive layer over entire surface of the substrate.

(f) Etching off the second gate insulation film leaving a parallel stripes arranged in an orthogonal direction to the first separation grooves. The spaces between the stripes are equal to the space between the memory cell FETs to be fabricated on the substrate, and the width of the stripes is equal to the gate length of the memory cell FETS. Then, etching off the second gate insulation film, the first conducting layer and first gate insulation film to expose the substrate.

(g) Implanting impurities into the exposed substrate to from sauce and drain of the cell FETs.

The etching processes in the steps (b) and (f) are self aligned etching process, therefore, the marginal space for the lithography is unnecessary. And the cell FETs are separated by insulation layers buried in the separation grooves, so no bird's beak appears.

So, the packing density of the memory cell FETs are increased to the limit of photolithographic resolution. Further aspects and advantages of the present invention will be apparent from the following description of preferred embodiments taken in connection with the accompanying drawings.

BRIEF DESCRIPTION OF DRAWINGS

FIG. 5 including parts a and b shows schematically a structure of the EPROM memory cell of FIG. 4, wherein:

FIG. 5(a) is a plan view of an EPROM device of the present invention; and

FIG. 5(b) is a cross sectional view or the device along a line BB and seen in a direction arrows in FIG. 5(a).

Throughout the drawings, same or like reference numerals designate same or corresponding parts.

DESCRIPTION OF PREFERRED EMBODIMENTS

The configuration of an EPROM memory cell of the present invention and its fabrication process will be described with respect to a preferred embodiment referring to FIGS. 4 and 5. The former are cross sectional views of the device schematically illustrating the fabrication steps, and the latter are a partial plan view of a pattern of the memory cell, and its cross section. The process and the technique applied in following disclosure are all conventional ones in the art, so detailed description of them are omitted for the sake of simplicity with the exception of special parts, about which will be described in detail. But the embodiment disclosed herein is a latest sample in the state-of-the-art.

Figure 4A:
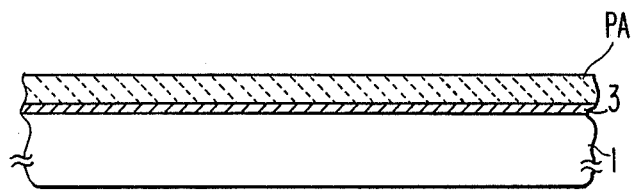
FIG. 4 including parts a, b, c, d, and e is a sectional view illustrating schematically the steps of process for fabricating an EPROM device of the present invention.

First, as shown in FIG. 4(a), on a p-type silicon substrate 1 having a resistivity of 10–20 Ohm cm for example, is formed a first gate oxide film 3 of silicon dioxide having a thickness of 50–500 Å by ordinary thermal oxidation. Successively, the entire surface of the substrate is coated by first conductive layer of polysilicon having a thickness of 3000–4000 Å. This first polysilicon layer (PA) is formed by a chemical vapor deposition (CVD), and it is doped with phosphorus or arsenic for example to have a conductivity. The doping is done by conventional gas diffusion or ion implantation for example, during or after the growth of the polysilicon PA.

Figure 4B:
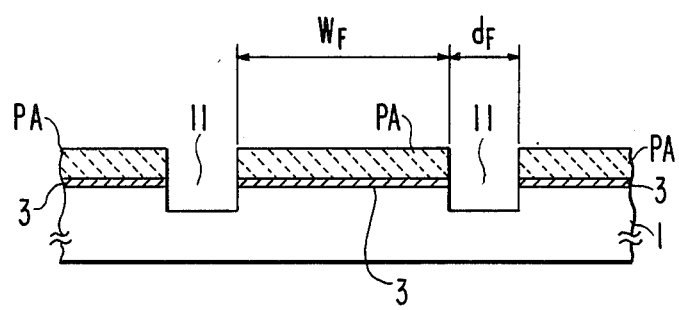

Next, as shown in FIG. 4(b), the first polysilicon layer PA is grooved with plurality of parallel device separation groves 11. Each of the grooves has a width dF of 1 μm and a depth of 0.6 μm for example. The depth of the grooves is not so critical. Therefore, the grooves 11 penetrate through the first polysilicon layer PA and the first gate oxide film 3, and they reach to the substrate 1 penetrating into it by a depth of 2000–4000 Å. These groves 11 are formed by photolithographic mask and conventional reactive ion etching (RIE). The grooves 11 are separated from each other by a distance $W_F$ which later becomes the gate width of the memory cell FETs. Though the distance $W_F$ is shown rather long in the figure, in an embodiment for example, the gate width $W_F$ is 1 μm.

Figure 4C:
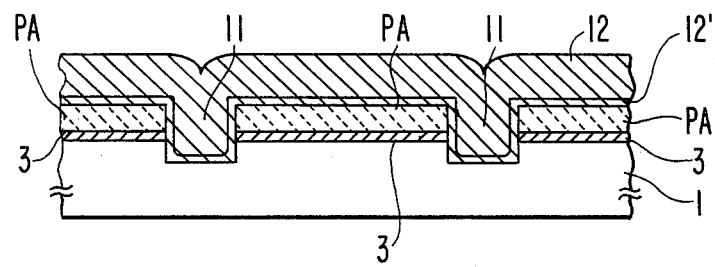

Successively, as shown in FIG. 4(c), a silicon dioxide layer 12 of 0.5–1 μm thick is formed on the entire surface of the substrate. So, the grooves 11 are perfectly buried by $SiO_2$. Before forming the $SiO_2$ layer 12, it is desirable to cover the entire surface of the substrate by a thermal oxidized thin $SiO_2$ film 12' of few hundreds Å thick. This $SiO_2$ film 12' protects the edge of the polysilicon layer PA which becomes later a floating gate of the memory cell FET from contaminations which might be included in the CVD grown thick $SiO_2$ layer 12, and prevent leakage current. But since the thin $SiO_2$ film 12' and the thick $SiO_2$ layer 12 are both silicon dioxide, and they cannot be identified from each other, so in the following drawings, this thin $SiO_2$ film 12' is eliminated.

Figure 4D:
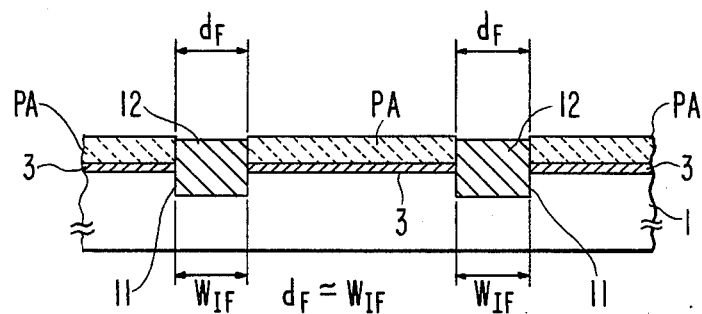

Next, as shown in FIG. 4(d), the surface of the substrate is polished until the surface of the polysilicon layer PA of polysilicon is exposed. The polishing may be done by mechanical polishing, but a reactive ion etching (RIE) using fluoroform ($CHF_3$) as an etchant gas is preferable to etch off the $SiO_2$ layer 12 to provide a flat etched surface. It is easy to stop the polishing or etching of the substrate watching the surface to expose the first polysilicon layer PA. If the RIE as described above is applied, $SiO_2$ is etched faster than the polysilicon, so precisely speaking, the surface of the buried $SiO_2$ 12 becomes slightly over etched than the surface of the first polysilicon layer PA as can be seen in FIG. 4(d). But the level difference between the surface of the first polysilicon PA and $SiO_2$ 12 in the groove 11 is negligibly small, so, a flat surface is obtained.

Later, the $SiO_2$ 12 in the groove 11 becomes the device separation region 13 buried in the substrate, and the width dF of the buried $SiO_2$ 12 becomes the device separation width $W_{IF}$ between the memory cell FETs. It will be noted that the photolithographic mask in used only once in the step of FIG. 4(b), and the device separation regions 13 are formed by self alignment, therefore, the device separation width $W_{IF}$ is equal to dF the width of the groove 11. There is no marginal space for the mask alignment on both sides of the gate width $W_F$. And since the separation regions 13 are formed by etching, there appears no bird's beak.

Figure 4E:
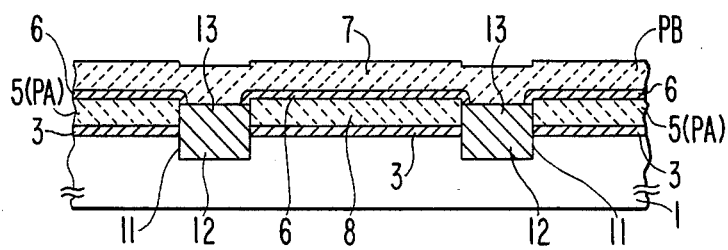

Next as shown in FIG. 4(e), the surface of the first polysilicon layer PA is covered with second gate oxide film 6 of 300–500 Å thick. It is fabricated by thermal oxidation. Then over the entire surface of the substrate is formed second polysilicon layer PB of 4000–4500 Å thick. The second polysilicon layer PB is deposited by CVD, and it is doped with phosphorus or arsenic during or after its growth by gas diffusion or ion implantation for example.

Succeedingly, the second polysilicon layer PB is patterned by photolithography to form a parallel stripes oriented in orthogonal direction to the device separation grooves 11. The width of the stripe becomes later the gate length of memory cell FET, and the spacing between the stripes becomes the spacing between the memory cells in the direction of gate length. In an embodiment, the width of the stripe is 1 μm, and the space between the stripes are 1.2–1.5 μm for example. Each of the stripes becomes a control gate electrode 7 which extends on both sides of the figure to form a word line WL as shown in FIG. 5. Utilizing this control gate electrode 7 as a mask, the second gate oxide film 6, first polysilicon layer PA and first gate oxide film 3 are etched off successively to expose the surface of the p-type silicon substrate.

By this etching process, the floating gates 8 of the memory cell FETs are formed underneath the gate electrode 7. The floating gates 8 are insulated from the substrate 1 and the gate electrode 7 respectively by the first and second gate oxide films 3 and 6. It will be understood that the floating gates 8 and the control gates 7 are self aligned, so there is no marginal space for the photolithography in the direction of the gate length. And there appears no bird's beak since the device separation region 13 is formed by etching. Thus the marginal space and bird's beak in both direction of the gate length and the gate width are cut down.

At this stage, it is desirable as shown in FIG. 5(b), to form a thin $SiO_2$ film 12'' of few hundreds Å thick, on both sides of the floating gates 8 and the control gates 7 to protect them from contamination. FIG. 5(b) is a cross sectional view of the device of FIG. 5(a) along a line BB and seen in the direction of arrows.

Then $n^+$-type impurities such as arsenic for example, are doped into the exposed surface of the substrate 1 to form the sources 9 and drains 10 as shown in FIG. 5. The doping may be done by ordinary process such as diffusion or ion implantation. If it is done by diffusion process, the thin $SiO_2$ film 12'' on the surface of the substrate 1 should be removed beforehand. But it may be left if the doping is done by ion implantation. Such processes are common ones in the art, so further description is omitted.

As can be seen in FIG. 5, the device separation regions 13 are not extended so long toward the direction of gate length, but they are interrupted at the source regions 9. This is a modification of the above described processes due to the fact that, in usual EPROM devices the source regions should be connected to each other in the direction of the word line WL. It will be understood for the one skilled in the art that such interruption of the device separation regions 13 can be done by interrupting the device separation grooves 11 at the stage of FIG. 4(B). By doing so, the interconnection wiring to connect each sources are saved.

In such a manner, the main part of the EPROM memory cell FETs are fabricated. Next step is interconnecting them on the surface of the substrate. Such process is a conventional one in the art. Though it is not shown in the figures, the surface of the device is coated by passivation layer of phospho-silicate glass (PSG) for example, and contact windows are opened to contact to the drains 10, for example. Then the interconnection wiring, such as bit lines for example, is done through these contact windows, and the device is completed.

Applying the above described invention to an EPROM device, the packing density of the memory cells have been increased by 30% compared to that of prior art device.

In the above description of preferred embodiment, the disclosure has been provided with respect to an application to an p-type silicon substrate. But it will be obvious that the process can be applied to n-type substrate merely varying the conductivity type of the impurity materials. The first and second polysilicon layers PA and PB may be replaced by other kind of conductive materials, such as metal silicide. The semiconductor material is not limited to the silicon, but the process of the invention may be applied to other kind of semiconductor materials, such as gallium arsenide for example. The presently disclosed embodiments are, therefore, to be considered in all respects as illustrative and not restrictive, the scope of the invention being indicated by the appended claims, rather than the foregoing description, and all changes which come within the meaning and range of equivalence of the claims are, therefore, to be embraced therein.

What is claimed is:

1. An erasable programmable read only memory (EPROM) device having plurality of memory cell FETs (field effect transistors) arranged in a matrix on a semiconductor substrate, said memory cell FET comprising:

a floating gate for storing voltage on it and controlling the conductivity of said memory cell FET;

a first gate insulation film provided between said floating gate and said substrate for insulating said floating gate from said substrate;

a control gate positioned over said floating gate for controlling the voltage of said floating gate;

a second gate insulation film provided between said floating gate and said control gate for insulating said floating gate from said control gate; and device separation regions provided on both sides in gate width direction of said floating gate for separating said memory cell FET from adjacent memory cell FETs on both sides, wherein said floating gate being positioned underneath said control gate, the width of said control gate being equal to the length of said floating gate, and said floating gate and said device separation regions are aligned side by side at the edge of the floating gate on its gate width sides.

2. An EPROM device according to claim 1, wherein said memory cell FET further comprising;

a thin insulation film covering side edges of said floating gate and said control gate.

3. An EPROM device according to claim 1, wherein said floating gate and control gate are made from polysilicon.

4. An EPROM device according to claims 1 or 2, wherein said substrate is made from silicon, said first gate insulation film, second gate insulation film and thin insulation film are made from silicon dioxide.

5. An EPROM device according to claims 1 or 2, wherein said floating gate and control gate are made from metal silicide.

* * * * *

UNITED STATES PATENT AND TRADEMARK OFFICE
CERTIFICATE OF CORRECTION

PATENT NO. : 4,734,887

DATED : MARCH 29, 1988

INVENTOR(S) : SHINJI SUGATANI

Figure 1A:
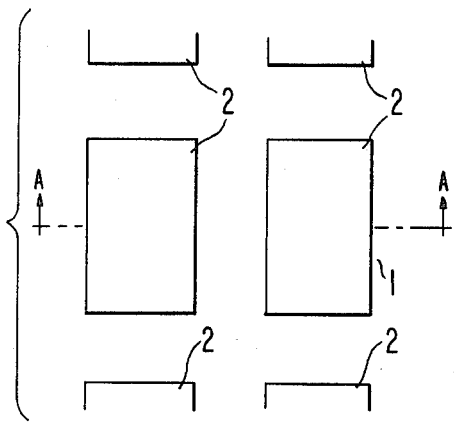
FIG. 1 including parts a, b and c are plan views of an elementary memory cell of an ordinary EPROM device, illustrating the steps of its fabrication by prior art process.
Figure 2A:
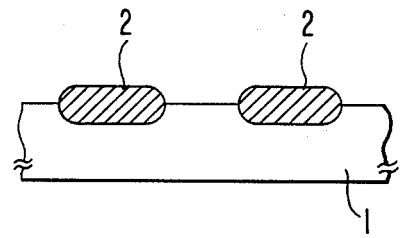
FIG. 2 comprised of parts a, b and c is a sectional view along the line AA and seen in the direction of arrows in FIG. 1 corresponding to respective fabrication steps.
Figure 1B:
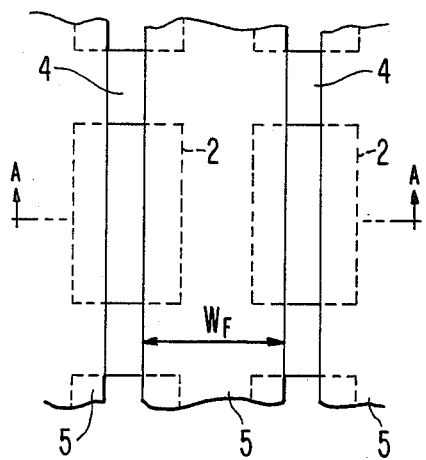
Figure 2B:
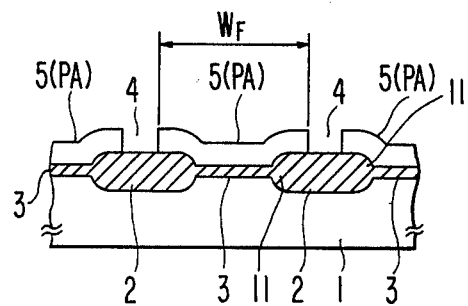
Figure 1C:
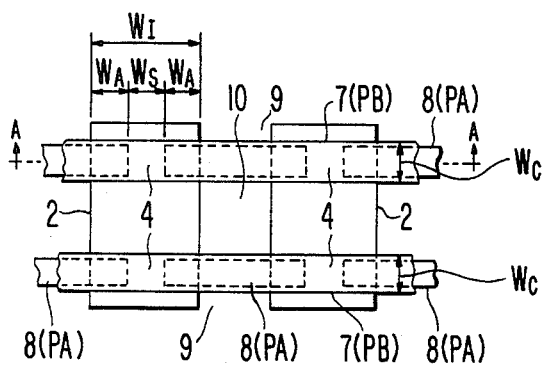
Figure 2C:
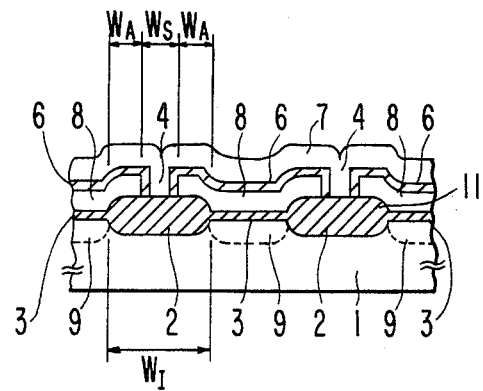
Figure 3A:
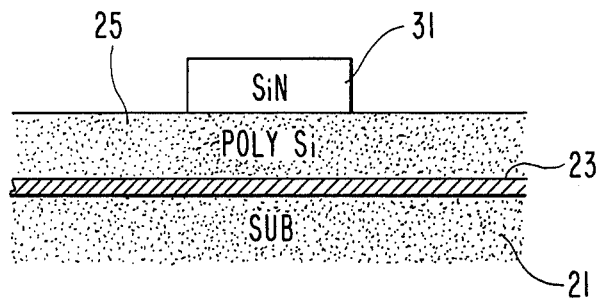
FIG. 3 including parts a, b, c and d illustrates schematically a prior art process which applies a self alignment method for fabricating a floating gate FET.
Figure 3B:
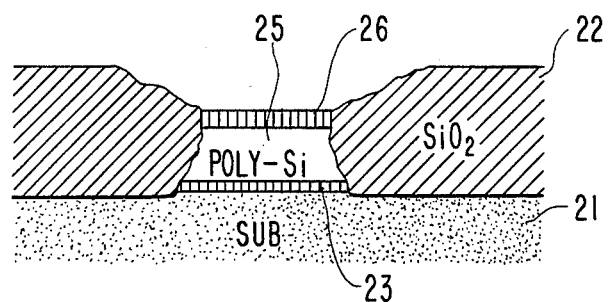
Figure 3C:
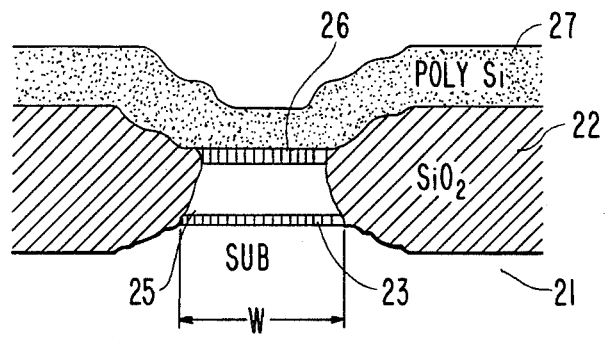
Figure 3D:
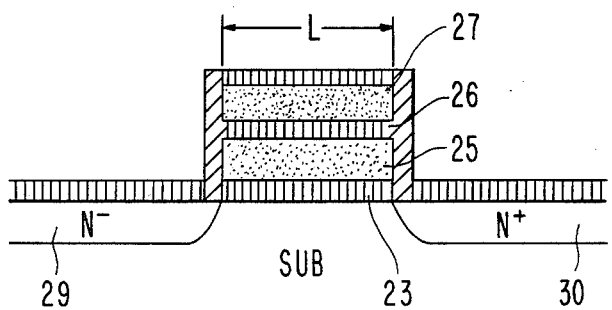

It is certified that error appears in the above-identified patent and that said Letters Patent is hereby corrected as shown below:

* IN THE DRAWINGS:

Sheet 1 of 4, FIG. 2(c) shown appear as shown on the attached sheet.

*Col. 3, line 50, "rist" should be --first--.

*Col. 4, line 4, "from sauce" should be --form source--.

Col. 8, line 20, "comprising;" should be --comprising:--.

UNITED STATES PATENT AND TRADEMARK OFFICE
CERTIFICATE OF CORRECTION

PATENT NO.  : 4,734,887            Page 2 of 2
DATED       : MARCH 29, 1988
INVENTOR(S) : SHINJI SUGATANI It is certified that error appears in the above-identified patent and that said Letters Patent is hereby corrected as shown below:

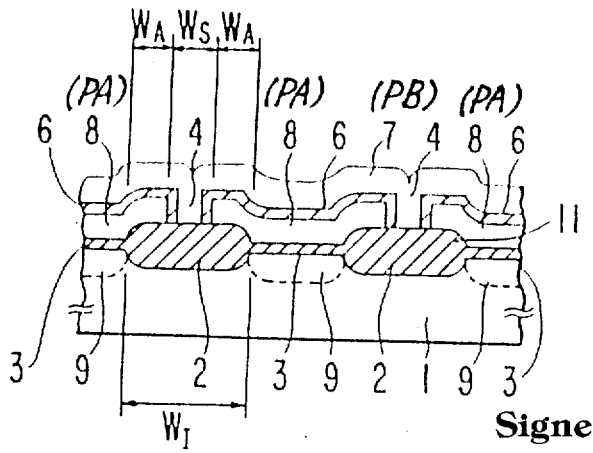

FIG. 2(c)
(PRIOR ART)

Signed and Sealed this

Twenty-third Day of August, 1988

Attest:

DONALD J. QUIGG

*Attesting Officer*    Commissioner of Patents and Trademarks